US011908357B2

(12) United States Patent
Lee et al.

(10) Patent No.: US 11,908,357 B2
(45) Date of Patent: Feb. 20, 2024

(54) POV DISPLAY DEVICE AND CONTROL METHOD THEREFOR

(71) Applicant: LG ELECTRONICS INC., Seoul (KR)

(72) Inventors: Kyungho Lee, Seoul (KR); Jaewoon Lee, Seoul (KR); Eungdoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/916,915

(22) PCT Filed: Apr. 23, 2020

(86) PCT No.: PCT/KR2020/005367
§ 371 (c)(1),
(2) Date: Oct. 4, 2022

(87) PCT Pub. No.: WO2021/215561
PCT Pub. Date: Oct. 28, 2021

(65) Prior Publication Data
US 2023/0154366 A1    May 18, 2023

(51) Int. Cl.
*G09G 3/00*       (2006.01)
*H01L 25/075*   (2006.01)
*H01L 25/16*     (2023.01)

(52) U.S. Cl.
CPC ......... *G09G 3/005* (2013.01); *H01L 25/0753* (2013.01); *H01L 25/167* (2013.01); *G09G 2360/12* (2013.01)

(58) Field of Classification Search
CPC ................................. G06F 16/22; G06F 3/147
See application file for complete search history.

(56) References Cited

U.S. PATENT DOCUMENTS

2005/0174482 A1* 8/2005 Yamada ................... H04N 9/12
345/1.3
2008/0246851 A1* 10/2008 Jung .................. H04N 21/4316
348/222.1

FOREIGN PATENT DOCUMENTS

JP          2001-154614          6/2001
KR          2016122324 A    * 10/2016 ............. G09F 11/02
KR          10-1741097            5/2017
(Continued)

OTHER PUBLICATIONS

PCT International Application No. PCT/KR2020/005367, Written Opinion and International Search Report dated Jan. 20, 2021, 9 pages.

*Primary Examiner* — Nan-Ying Yang
(74) *Attorney, Agent, or Firm* — LEE, HONG, DEGERMAN, KANG & WAIMEY

(57) ABSTRACT

The present invention provides a persistence of vision (POV) display device using a light emitting element, the display device comprising: a fixed module including a motor; a rotating module located on the fixed module and rotated by the motor; at least one panel coupled to the rotating module; a plurality of light sources arranged on the panel and having a plurality of pixels; a light source module including a light emitting element array in which the plurality of light sources are arranged in a longitudinal direction; memory that stores video data received from an external source device; and a controller that controls the order of input of the video data and the order of output of the video data.

2 Claims, 11 Drawing Sheets

(56) References Cited

FOREIGN PATENT DOCUMENTS

| KR | 10-1981850 | 5/2019 |
| KR | 10-2020797 | 9/2019 |
| KR | 10-2020800 | 9/2019 |

* cited by examiner (a)          (b)

POV DISPLAY DEVICE AND CONTROL METHOD THEREFOR

CROSS-REFERENCE TO RELATED APPLICATIONS

This application is the National Stage filing under 35 U.S.C. 371 of International Application No. PCT/KR2020/005367, filed on Apr. 23, 2020, the contents of which are hereby incorporated by reference herein its entirety.

TECHNICAL FIELD

The present disclosure is applicable to a display device-related technical field, and relates, for example, to a POV (Persistence of Display) display device using light emitting diodes (LEDs), which are semiconductor light emitting elements.

BACKGROUND ART

In a field of a display technology, display devices having excellent characteristics such as thinness, flexibility, and the like have been developed. On the other hand, currently commercialized major displays are represented by a LCD (liquid crystal display) and an OLED (organic light emitting diode).

Recently, there is a POV (Persistence of Display) display device that may reproduce various characters and graphics as well as moving images using an afterimage effect of a human by rotating a light emitting module in which light emitting elements are one-dimensionally arranged, and at the same time, driving the light emitting module at a high speed based on an angle.

In general, when continuously observing 24 or more still images for each second, a viewer recognizes the still images as the moving image. A conventional image display device, such as a CRT, the LCD, or a PDP, displays still images of 30 to 60 frames for each second, so that the viewer may recognize the still images as the moving image. In this regard, when continuously observing more still images for each second, the viewer may feel smoother images. As the number of still images displayed for each second decreases, it becomes difficult to smoothly display the images.

In this regard, in the POV display, as a difference between image data input to a memory and image data output is generated, a phenomenon in which an image is torn, that is, a tearing phenomenon occurs.

Therefore, a method for preventing such tearing phenomenon of the POV display device is required.

DISCLOSURE

Technical Problem

The present disclosure is to provide a POV (Persistence of Vision) display device that suppresses an occurrence of a tearing phenomenon of a screen.

Technical Solutions

As a first aspect for achieving the above object, the present disclosure provides a persistence of vision (POV) display device using light emitting elements including a fixed module including a motor, a rotatable module positioned on the fixed module and rotated by the motor, at least one panel coupled to the rotatable module, a plurality of light sources arranged on the panel and constituting a plurality of pixels, a light source module including a light emitting element array having the plurality of light sources arranged in a longitudinal direction, a memory for storing video data received from an external source device, and a controller that controls an input order of the video data and an output order of the video data.

In addition, the controller may divide one video frame based on the number of panels and then input the divided video frames into the memory.

In addition, the controller may store the divided video frames in the memory in parallel with each other or in data packet units.

In addition, the controller may convert an image only at a time point of conversion of the video frame.

In addition, the panel may include a plurality of panels and the memory may include a plurality of memories.

In addition, the controller may divide one video frame based on the number of panels and then input the divided video frames into the plurality of memories.

In addition, the controller may store the divided video frames in the memories in parallel with each other or in data packet units.

In addition, the controller may convert an image only at a time point of conversion of the video frame.

As a second aspect for achieving the above object, the present disclosure provides a method for controlling a persistence of vision (POV) display device including receiving video data from an external source device, dividing one video frame contained in the received video data based on the number of panels included in the POV display device, inputting the divided video frames into a memory, and outputting the divided video frames from the memory, wherein a controller controls an order of inputting the video frames from the external source device to the memory and an order of outputting the video frames from the memory to the panel.

In addition, the inputting of the divided video frames into the memory may include storing the divided video frames in parallel with each other or in data packet units.

ADVANTAGEOUS EFFECTS

According to one embodiment of the present disclosure, the problem as described above may be solved.

That is, the tearing phenomenon of the image in the POV display device may be prevented.

Furthermore, in the present disclosure, there are additional technical effects not mentioned here, and those skilled in the art are able to understand such effects through the entirety of the specification and the drawings.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
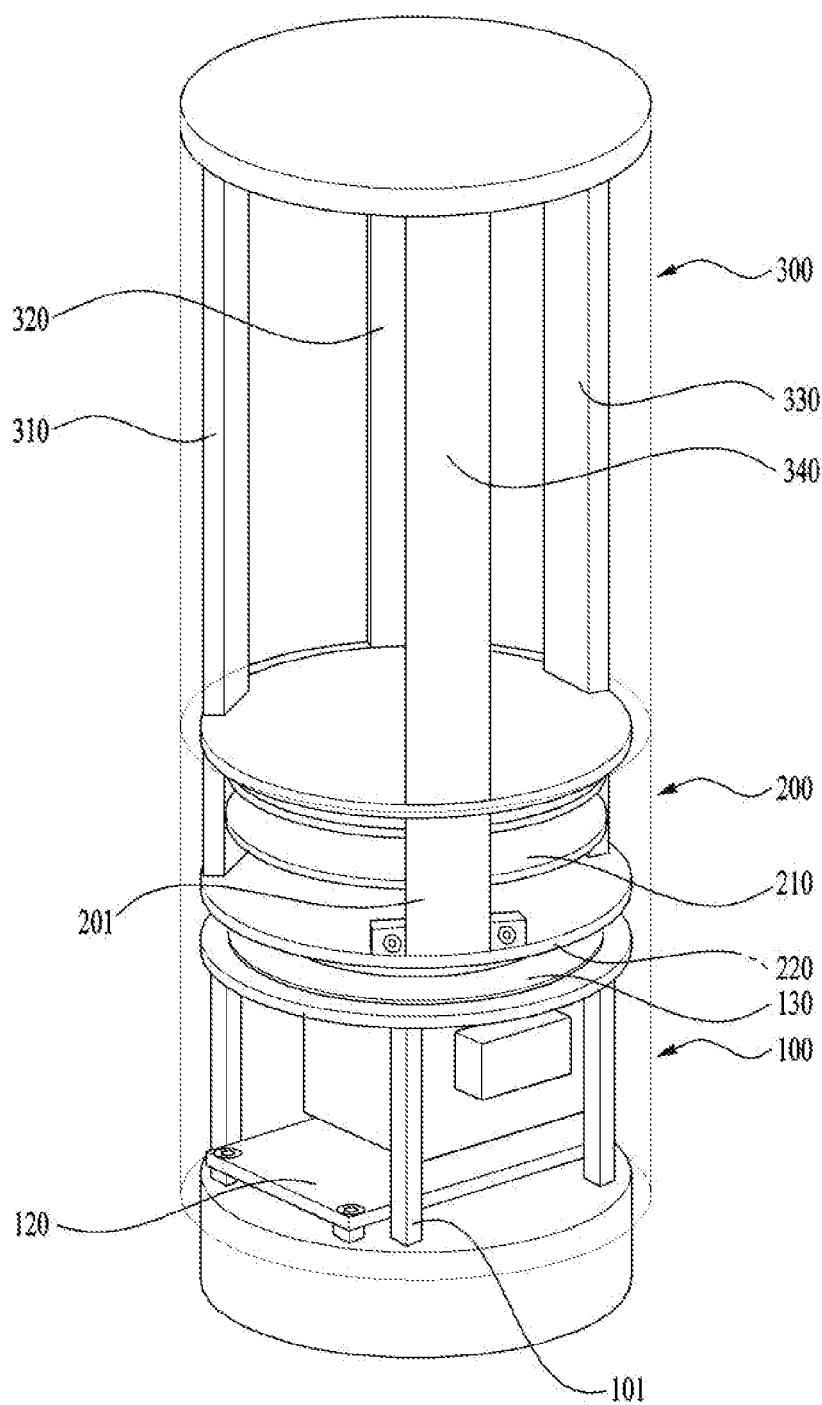
FIG. 1 is a perspective view showing a POV (Persistence Of Visual) display device according to an embodiment of the present disclosure.

FIG. 1 is a perspective view showing a POV (Persistence Of Visual) display device according to an embodiment of the present disclosure.

FIG. 1 shows a POV display device in which each light emitting element array (not shown, see FIG. 2) is disposed on each of fan type-panels 310, 320, 330, and 340 in a longitudinal direction of each panel. Although FIG. 1 shows the fan type-POV display device, the present disclosure is also applicable to a display device that requires input/output of data, such as a cylinder type POV display device.

Such POV display device may include a fixed module 100 including a motor (not shown, see FIG. 7), a rotatable module 200 positioned on this fixed module 100 and rotated by the motor, and a light source module 300 that is coupled to the rotatable module 200, includes the light emitting element arrays, and displays an afterimage by the rotation so as to implement a display.

In this regard, the light source module 300 may include the one or more bar-shaped panels 310, 320, 330, and 340 radially disposed from a central point of rotation. However, this is an example, and the light source module 300 may include one or more panels.

The light source module 300 may include the light emitting element arrays arranged on the panels 310, 320, 330, and 340 in the longitudinal direction, respectively.

Each of the panels constituting the light source module 300 may form a printed circuit board (PCB). That is, each of the panels may have a function of the printed circuit board. In each of such panels, each of the light emitting element arrays may implement individual unit pixels and may be disposed in the longitudinal direction of each of the panels 310, 320, 330, and 340.

The panels 310, 320, 330, and 340 respectively equipped with such light emitting element arrays may implement the display while rotating using the afterimage. The implementation of the afterimage display will be described in detail below.

As such, the light source module 300 may be composed of the panels 310, 320, 330, and 340 on which the light emitting element arrays are respectively arranged.

That is, multiple light emitting elements (not shown, see FIG. 4) may be arranged in one direction on each of the panels 310, 320, 330, and 340 to constitute pixels so as to constitute each of the light emitting element arrays. In this regard, a light emitting diode (LED) may be used as the light emitting element.

On each of the panels 310, 320, 330, and 340, each of the light emitting element arrays on which the light emitting elements are arranged to form individual pixels in one direction and are linearly installed may be disposed.

As mentioned above, the light source module 300 may be composed of the multiple panels 310, 320, 330, and 340, but may also be implemented with a single panel including the light emitting element arrays. However, when the light source module 300 is implemented with the multiple panels as in the example in FIG. 1, because the multiple panels may implement one frame image in a divided manner, the light source module 300 may rotate at a lower rotation speed than when implementing the image of the same frame.

In one example, the fixed module 100 may form frame structures. That is, the fixed module 100 may include multiple frames 101 that are designed to be divided from each other and coupled with each other.

Such frame structures may provide a space in which the motor may be installed, and may provide a space in which a power supply 120, an RF module (not shown, see FIG. 7), and the like are installed.

In addition, a weight (not shown) may be installed in the fixed module 100 in order to reduce an effect of the high-speed rotation of the rotatable module 200.

Similarly, the rotatable module 200 may form frame structures. That is, the rotatable module 200 may include multiple frames 201 that are designed to be divided from each other and coupled with each other.

Such frame structures may provide a space in which a driving circuit for driving the light emitting element arrays to implement the display is installed.

In this regard, a driving shaft of the motor may be fixed with a shaft fixing module formed in a lower frame 201 of the rotatable module 200. As such, the driving shaft of the motor and a center of rotation of the rotatable module 200 may be located on the same axis.

In addition, the light source module 300 may be fixedly installed on the frame 201.

In one example, power may be transferred between the fixed module 100 and the rotatable module 200 in a wireless power transfer scheme. To this end, a transfer coil 130 for transmitting wireless power may be installed at a top of the fixed module 100, and a receiving coil 220 located at a position facing the transfer coil 130 may be installed at a bottom of the rotatable module 200.

Figure 2:
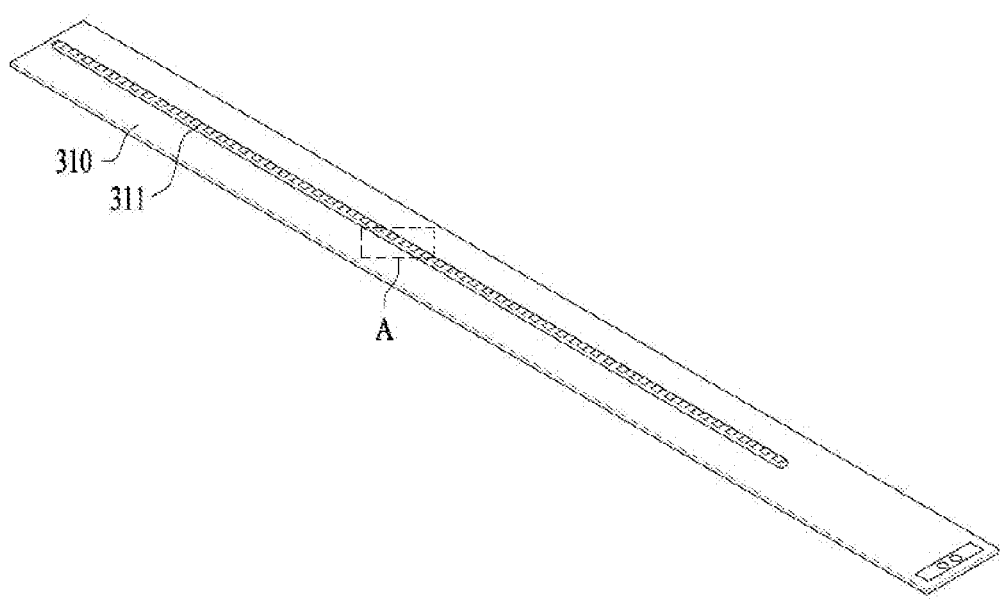
FIG. 2 is a perspective view showing a front surface of a light source module according to an embodiment of the present disclosure.
Figure 3:
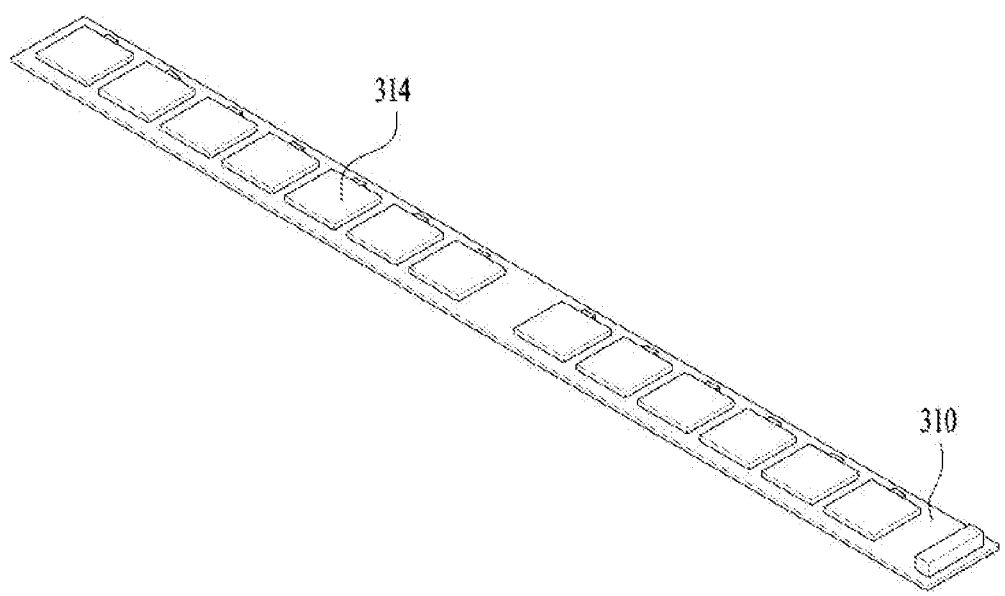
FIG. 3 is a perspective view showing a rear surface of a light source module according to an embodiment of the present disclosure.

FIG. 2 is a perspective view showing a front surface of a light source module according to an embodiment of the present disclosure, and FIG. 3 is a perspective view showing a rear surface of a light source module according to an embodiment of the present disclosure.

Although FIGS. 2 and 3 illustrate a first panel 310 of one embodiment of the present disclosure as an example, the same may be applied to other panels 320, 330, and 340.

Referring to FIG. 2, one panel 310 constituting the light source module 300 is shown. As mentioned above, such panel 310 may be a printed circuit board (PCB). Multiple light emitting elements (not shown, see FIG. 4) may be arranged on the panel 310 and installed in one direction to form pixels so as to form a light emitting element array 311. In this regard, the light emitting diode (LED) may be used as the light emitting element.

That is, a light emitting element array 311 in which light emitting elements 312 are arranged so as to form individual pixels in one direction and are linearly installed may be disposed on one panel 310.

FIG. 3 shows a rear surface of the panel 310. Driver modules 314 for driving the light emitting elements (not shown, see FIG. 4) may be installed on the rear surface of the panel 310 constituting such light source module 300. The driver module 314 may be, for example, a driver IC.

As such, the driver modules 314 are installed on the rear surface of the panel 310, so that a light emitting surface of the panel may not be disturbed, an effect on lighting of light sources (the light emitting elements) caused by interference or the like may be minimized, and the panel 310 may be constructed with a minimal area. Such panel 310 with the small areas may improve transparency of the display.

In one example, the front surface of the panel 310 on which the light emitting element array 311 is installed may be treated with a dark color (for example, black) so as to improve a contrast ratio, a color, and the like of the display, thereby maximizing an effect of the light sources.

Figure 4:
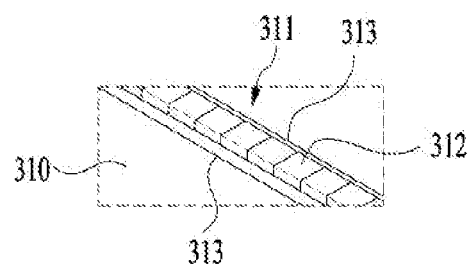
FIG. 4 is a partially enlarged view of FIG. 2.
Figure 5:
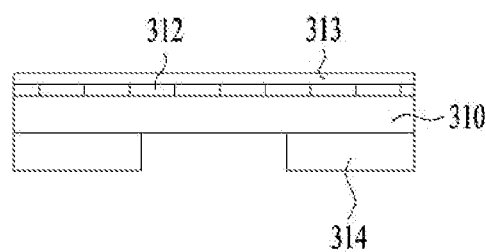
FIG. 5 is a cross-sectional view of a light source module according to an embodiment of the present disclosure.

FIG. 4 is a partially enlarged view of FIG. 2, and FIG. 5 is a cross-sectional view of the light source module 300 according to an embodiment of the present disclosure.

Referring to FIG. 4, it may be seen that the individual light emitting elements 312 are linearly installed in one direction (a length direction of the panel). In this regard, a protection portion 313 for protecting the light emitting elements 312 may be positioned outwardly of the light emitting elements 312.

In such light emitting elements 312, red, green, and blue light emitting elements 312 may constitute one pixel so as to realize natural colors, and such individual pixels may be installed on the panel 310 in one direction.

Referring to FIG. 5, the light emitting elements 312 may be protected by the protection portion 313. In addition, as described above, the driver modules 314 may be installed on the rear surface of the panel 310 so as to drive the light emitting elements 312 in units of pixels or sub-pixels. In this regard, one driver module 314 may individually drive at least one pixel.

Figure 6:
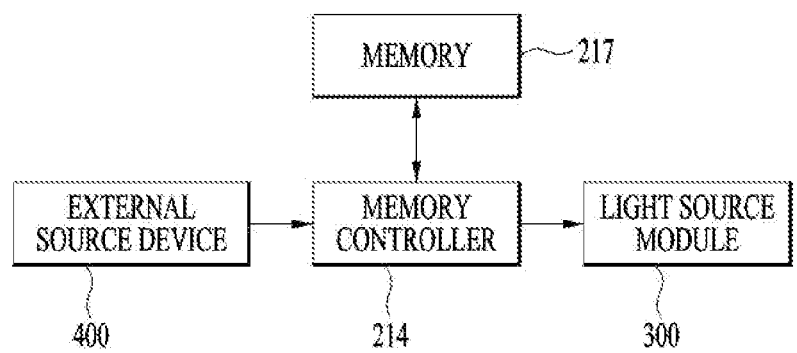
FIG. 6 is a block diagram of a POV display device according to an embodiment of the present disclosure.

FIG. 6 is a block diagram of a POV display device according to an embodiment of the present disclosure.

A memory controller 214 may receive video data from an external source device 400 and input the received video data to a memory 217. In addition, the memory controller 214 may output video data required by the light source module 300 and transmit the video data to the driver module 314.

That is, the memory controller 214 may divide the video data and control an order in which the divided data are input to the memory 217 and an order in which the divided data are output from the memory 217 so as to allow an image to be converted only at a time point of frame conversion, thereby preventing a phenomenon in which an image is torn, that is, a tearing phenomenon during frame conversion.

In this regard, an image scanning rate and a frames per second (FPS) do not necessarily match each other.

The memory 217 may be either an internal or external memory.

Figure 7:
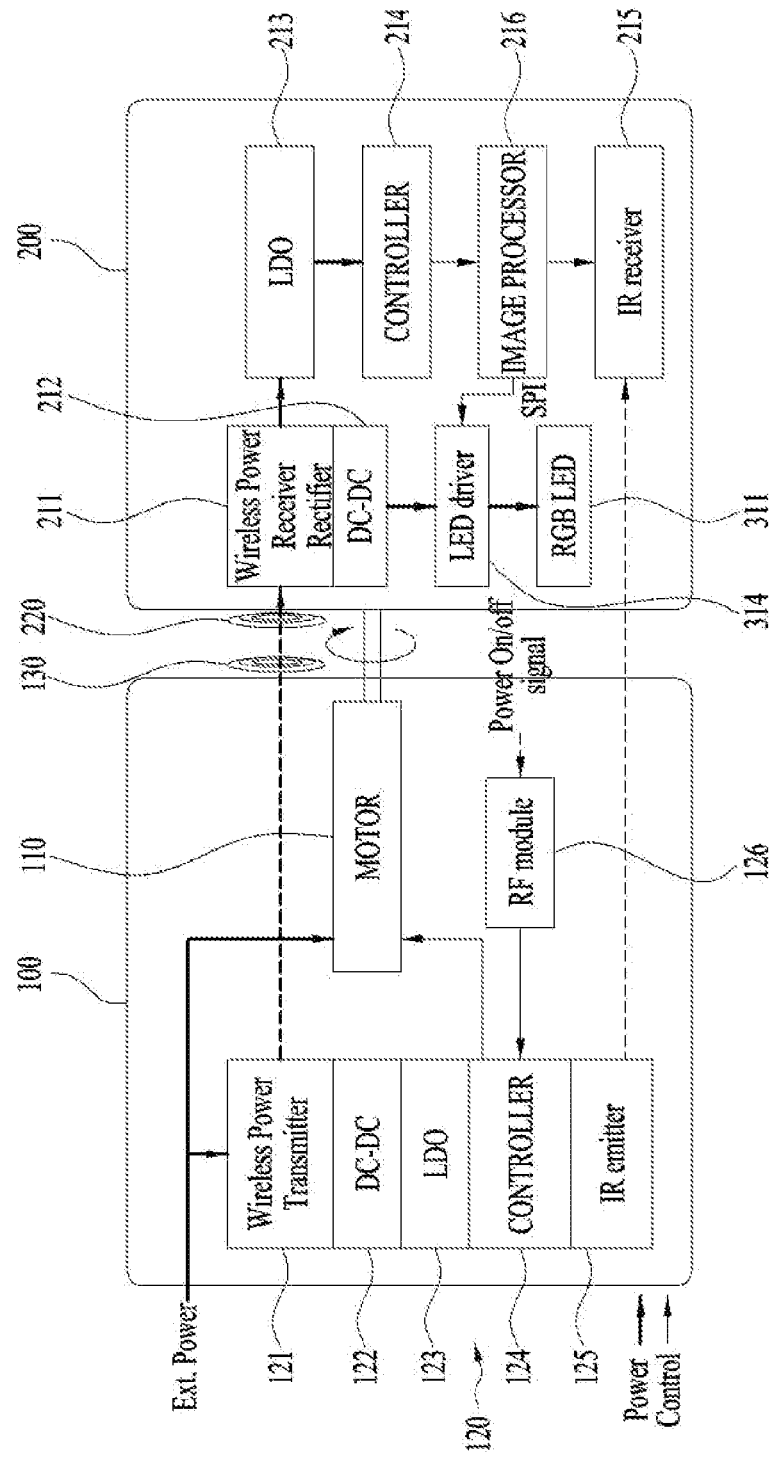
FIG. 7 is a block diagram of a POV display device according to an embodiment of the present disclosure.

FIG. 7 is a block diagram of a POV display device according to an embodiment of the present disclosure.

Hereinafter, a configuration for driving the POV display device will be briefly described with reference to FIG. 7.

First, a driving circuit 120 may be installed in the fixed module 100. Such driving circuit 120 may include a power supply. The driving circuit 120 may include a wireless power transmitter 121, a DC-DC converter 122, and an LDO 123 for supplying individual voltages.

External power may be supplied to the driving circuit 120 and the motor 110.

In addition, the fixed module 100 may have an RF module 126, so that the display may be driven by a signal transmitted from the outside.

In one example, the fixed module 100 may have means for sensing the rotation of the rotatable module 200. An infrared ray may be used as such means for sensing the rotation. Accordingly, an IR emitter 125 may be installed in the fixed module 100, and an IR receiver 215 may be installed in the rotatable module 200 at a location corresponding to an infrared ray emitted from such IR emitter 125.

In addition, the fixed module 100 may include a controller 124 for controlling the driving circuit 120, the motor 110, the IR emitter 125, and the RF module 126.

In one example, the rotatable module 200 may include a wireless power receiver 211 for receiving a signal from the wireless power transmitter 121, a DC-DC converter 212, and an LDO 213 for supplying individual voltages.

The rotatable module 200 may have an image processor 216 that processes the image to be realized via the light emitting element arrays using RGB data of the displayed image. A signal processed by the image processor 216 may be transmitted to the driver module 314 of the light source module 300 so as to realize the image.

In addition, in the rotatable module 200, a controller 214 for controlling the wireless power receiver 211, the DC-DC converter 212, the LDO 213, the IR receiver 215, and the image processor 216 may be installed.

Such image processor 216 may generate a signal for controlling light emission of the light sources of the light source module 300 based on image data to be output. In this regard, data for the light emission of the light source module 300 may be internal or external data.

The data stored internally (in the rotatable module) 200 may be image data stored in advance in a storage device, such as a memory (e.g., a SD card), mounted together in the image processor 216. The image processor 216 may generate the light emission control signal based on such internal data.

The image processor 216 may transmit, to the driver module, a signal for controlling image data of a specific frame to be displayed on each light emitting element array after delay.

In addition, the image processor 216 may receive the image data from the fixed module 100. In this regard, the external data may be output via an optical data transmitting device with the same principle as a photo coupler, or a data transmitting device of an RF scheme such as Bluetooth or Wi-Fi.

In this regard, as mentioned above, the means for sensing the rotation of the rotatable module 200 may be disposed. That is, as means for recognizing a location (a speed) with respect to the rotation, such as an absolute location and a relative location with respect to the rotation, so as to output light source data suitable for each rotational position (speed) during the rotation of the rotatable module 200, the IR emitter 125 and the IR receiver 215 may be arranged. In one example, the same function may be implemented via an encoder, a resolver, and a Hall sensor.

In one example, data required to drive the display may optically transmit a signal at a low cost using the principle of the photo coupler. That is, when the light emitting elements and light receiving elements are positioned in the fixed module 100 and the rotatable module 200, the data may be received without interruption even when the rotatable module 200 rotates. In this regard, the IR emitter 125 and the IR receiver 215 described above may be used for such data transmission.

As described above, the power may be transferred between the fixed module 100 and the rotatable module 200 using the wireless power transfer (WPT).

The power may be supplied without a wire connection using a resonance shape of the wireless power transfer coil.

To this end, the wireless power transmitter 121 may convert the power into an RF signal of a specific frequency, and a magnetic field generated by a current flowing through the transfer coil 130 may generate an induced current in the receiving coil 220.

In this regard, a natural frequency of the coil and a transmission frequency at which actual energy is transmitted may be different from each other (a magnetic induction scheme).

In one example, resonant frequencies of the transfer coil 130 and the receiving coil 220 may be the same with each other (a self-resonant scheme).

The wireless power receiver 211 may convert the RF signal input from the receiving coil 220 into a direct current so as to transmit required power to a load.

Figure 8:
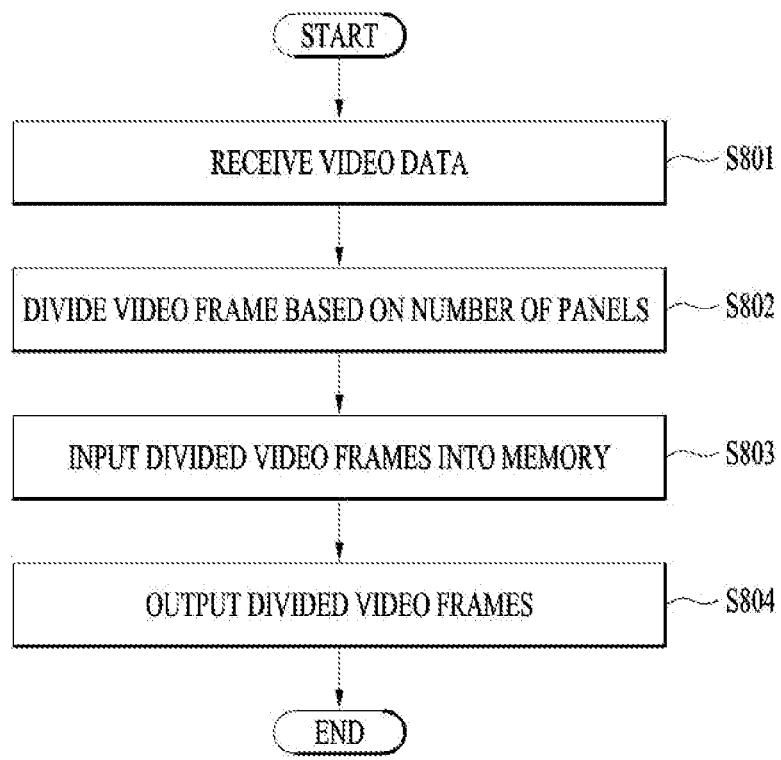
FIG. 8 is a flowchart of one embodiment of the present disclosure.

FIG. 8 is a flowchart of one embodiment of the present disclosure.

As shown in FIG. 8, the memory controller 214 receives the video data from the external source device 400 (s801).

In addition, the memory controller 214 divides a frame of the received video data based on the number of panels of the POV display device (s802), and inputs the divided video frames into the memory 217 (s803).

The divided video frames are output (s804).

In a following embodiment, it is shown that there are four panels, but the number of panels is not limited thereto.

Figure 9:
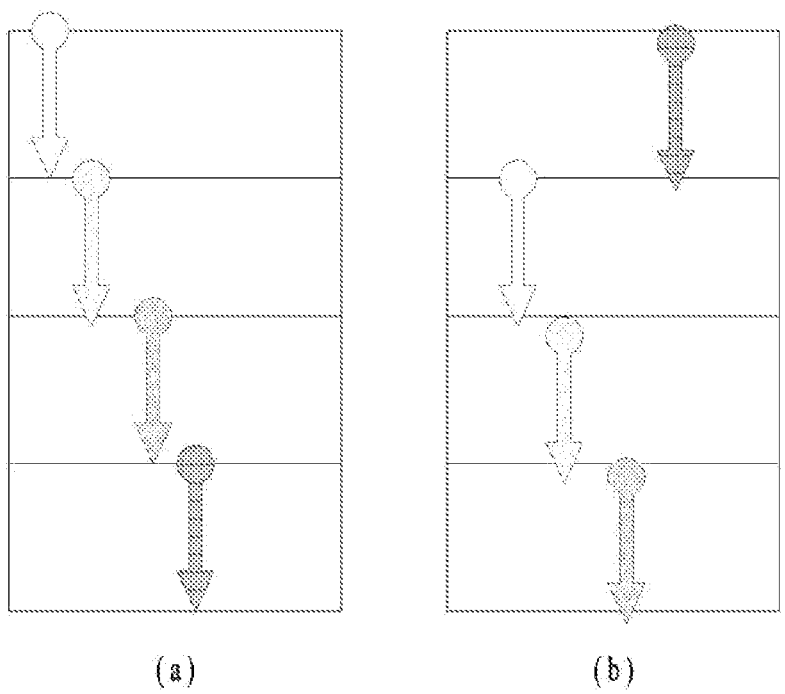
FIG. 9 is a diagram showing a video frame output order of panels.

FIG. 9 is a diagram showing a video frame output order of panels.

In (a) in FIG. 9, an Nth frame is shown, and in (b) in FIG. 9, an N+1th frame is shown. In other words, even when one video frame is input, when there are 4 panels, the frame is output after being divided based on the number of panels.

Figure 10:
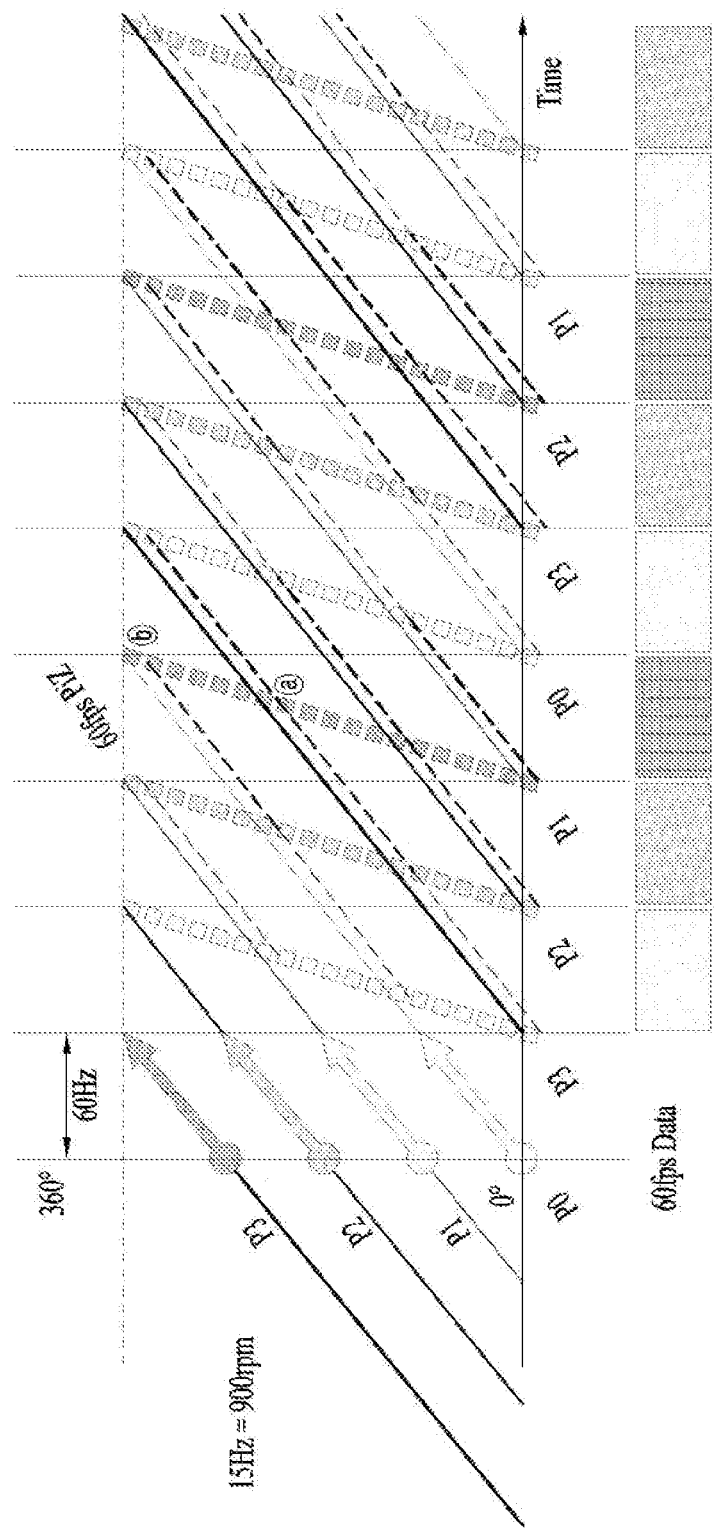
FIG. 10 is a graph showing input video data and output video data of the prior art.

FIG. 10 is a graph showing input video data and output video data of the prior art.

As shown in FIG. 10, in the prior art, the video data is output in a manner of being divided based on the number of panels P0, P1, P2, and P3. Movement paths of the panels P0, P1, P2, and P3 are indicated by solid lines.

However, in the prior art, an entirety of one video frame was input (bold dotted lines) to the memory 217 without the division, and the video frame was sequentially output from the memory 217 to the panels P0, P1, P2, and P3. Therefore, the tearing phenomenon in which the image is torn occurred as one frame was converted at a time point that is not a time point at which the frame is converted as shown in ⓐ or two frames were converted together as shown in ⓑ.

Figure 11:
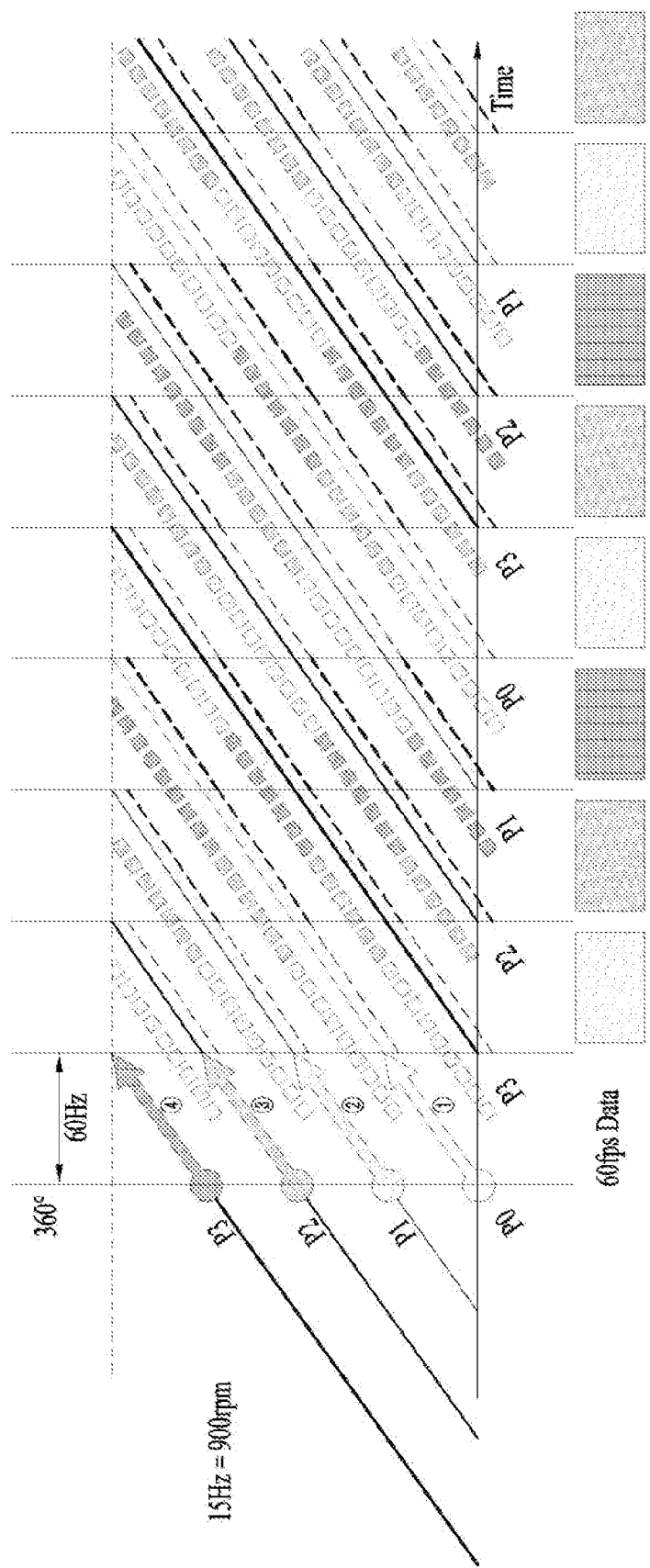
FIG. 11 is a graph showing input image data and output image data according to an embodiment of the present disclosure.

FIG. 11 is a graph showing input image data and output image data according to an embodiment of the present disclosure.

As shown in FIG. 9, the video data are output based on the number of panels P0, P1, P2, and P3. The movement paths of the panels P0, P1, P2, and P3 are indicated by solid lines.

Unlike the prior art, in the present disclosure, in order to synchronize the input and the output with each other, the memory controller 214 may divide one video frame input from an external source in an order of ①, ②, ③, and ④, which is an order of the panels to be output, and input (bold dotted lines) the divided video frames to the memory 217. In addition, the memory controller 214 may output (thin dotted lines) the divided video data from the memory 217 based on the order of the input video data.

For this reason, the input data and the output data may be prevented from not being synchronized with each other, so that the tearing phenomenon may be prevented.

In addition, one frame image may be divided based on the number of panels, and the divided frame images may be stored in parallel with each other or in data packet units.

In this regard, the image scanning rate and the frames per second (FPS) do not necessarily match each other, but the image may be designed to be converted only at the time point at which the frame is converted.

As described above, in the present disclosure, the POV display device may divide the data and input the divided date to the memory so as to synchronize the input and the output with each other, thereby allowing the image to be converted only at the time point of the frame conversion. Therefore, the occurrence of the phenomenon in which the screen is torn, that is, the tearing phenomenon during the frame conversion may be solved.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A persistence of vision (POV) display device comprising:
   a fixed module including a motor;
   a rotatable module positioned on the fixed module and configured to be rotated by the motor;
   at least one panel coupled to the rotatable module;
   a plurality of light sources arranged on the panel and constituting a plurality of pixels;
   a light source including a light emitting element array having the plurality of light sources arranged in a longitudinal direction;
   a memory configured to store video data received from an external source device; and
   a controller,
   wherein the panel includes a plurality of panels and the memory includes a plurality of memories, and the controller is configured to:
      receive video data from an external source device, the video data comprised of a plurality of video frames,
      based on a number of the plurality of panels and a display order of the plurality of panels, divide the video data by dividing individual video frames of the video data to create a plurality of video frame portions for each video frame,
      wherein a number plurality of video frame portions for each video frame is equal to the number of the plurality of panels,
      for all video frames of the divided video data, controllably input the respective plurality of video frame portions into respective ones of the plurality of memories in parallel with each other or in data packet units,
      for all video frames of the divided video data, controllably output the respective plurality of video frame portions from respective ones of the plurality of memories,
      wherein, for all video frames of the divided video data, an order in which the divided data are input to the memory and an order in which the divided data are output from the memory is controlled so as to allow an image to be converted only at a time point of frame conversion.

2. A method for controlling a persistence of vision (POV) display device, wherein the POV display device includes a fixed module including a motor, a rotatable module positioned on the fixed module and configured to be rotated by the motor, at least one panel coupled to the rotatable module, a plurality of light sources arranged on the panel and constituting a plurality of pixels, a light source including a light emitting element array having the plurality of light sources arranged in a longitudinal direction, a memory configured to store video data received from an external source device, and a controller, wherein the panel includes a plurality of panels and the memory includes a plurality of memories, the method comprising:
   receiving video data from an external source device, the video data comprised of a plurality of video frames;
   based on a number of the plurality of panels and a display order of the plurality of panels, dividing the video data by dividing individual video frames of the video data to create a plurality of video frame portions for each video frame,
   wherein a number plurality of video frame portions for each video frame is equal to the number of the plurality of panels;
   for all video frames of the divided video data, controllably inputting the respective plurality of video frame portions into respective ones of the plurality of memories in parallel with each other or in data packet units; and
   for all video frames of the divided video data, controllably outputting the respective plurality of video frame portions from respective ones of the plurality of memories,
   wherein, for all video frames of the divided video data, an order in which the divided data are input to the memory and an order in which the divided data are output from the memory is controlled so as to allow an image to be converted only at a time point of frame conversion.

* * * * *